United States Patent
Liu et al.

(10) Patent No.: US 7,834,960 B2
(45) Date of Patent: Nov. 16, 2010

(54) THIN FILM TRANSISTOR ARRAY SUBSTRATE STRUCTURES

(75) Inventors: Yu-Wei Liu, Hsinchu (TW); Hui-Fen Lin, Hsinchu (TW); Feng-Yuan Gan, Hsinchu (TW); Shu-Chin Lee, Hsinchu (TW); Yen-Heng Huang, Hsinchu (TW)

(73) Assignee: Au Optronics Corp., Hsinchu (TW)

( * ) Notice: Subject to any disclaimer, the term of this patent is extended or adjusted under 35 U.S.C. 154(b) by 0 days.

(21) Appl. No.: 12/703,926

(22) Filed: Feb. 11, 2010

(65) Prior Publication Data

US 2010/0140625 A1    Jun. 10, 2010

Related U.S. Application Data

(60) Division of application No. 11/859,832, filed on Sep. 24, 2007, now Pat. No. 7,688,419, which is a continuation-in-part of application No. 11/461,015, filed on Jul. 31, 2006, now abandoned.

(30) Foreign Application Priority Data

May 11, 2006    (TW) ............................. 95116687 A

(51) Int. Cl.
    *G02F 1/1335*    (2006.01)
(52) U.S. Cl. .......................... 349/106; 349/39; 349/110
(58) Field of Classification Search ................... None
    See application file for complete search history.

(56) References Cited

U.S. PATENT DOCUMENTS

| | | | |
|---|---|---|---|
| 6,894,747 B2 | 5/2005 | Okumura | |
| 6,897,927 B2 * | 5/2005 | Tanaka et al. | ............... 349/129 |
| 7,292,294 B2 | 11/2007 | Hung | |
| 2003/0048399 A1 | 3/2003 | Okumura | |
| 2004/0125280 A1 | 7/2004 | Kim | |
| 2005/0012150 A1 | 1/2005 | Byun et al. | |
| 2005/0140858 A1 * | 6/2005 | Park | ............ 349/110 |
| 2005/0243232 A1 | 11/2005 | Park et al. | |
| 2007/0165180 A1 | 7/2007 | Cho | |

FOREIGN PATENT DOCUMENTS

| | | |
|---|---|---|
| CN | 1403861 A | 3/2003 |
| CN | 1506737 A | 6/2004 |
| CN | 1518774 A | 8/2004 |
| CN | 1693976 A | 11/2005 |

* cited by examiner

*Primary Examiner*—Richard H Kim
(74) *Attorney, Agent, or Firm*—Thomas, Kayden, Horstemeyer & Risley

(57) ABSTRACT

A thin film transistor array substrate structure. The array substrate structure includes a thin film transistor array substrate, an organic material layer formed thereon, and a plurality of black matrices and color filter patterns disposed on the organic material layer. The invention also provides a method of fabricating the thin film transistor array substrate.

8 Claims, 5 Drawing Sheets

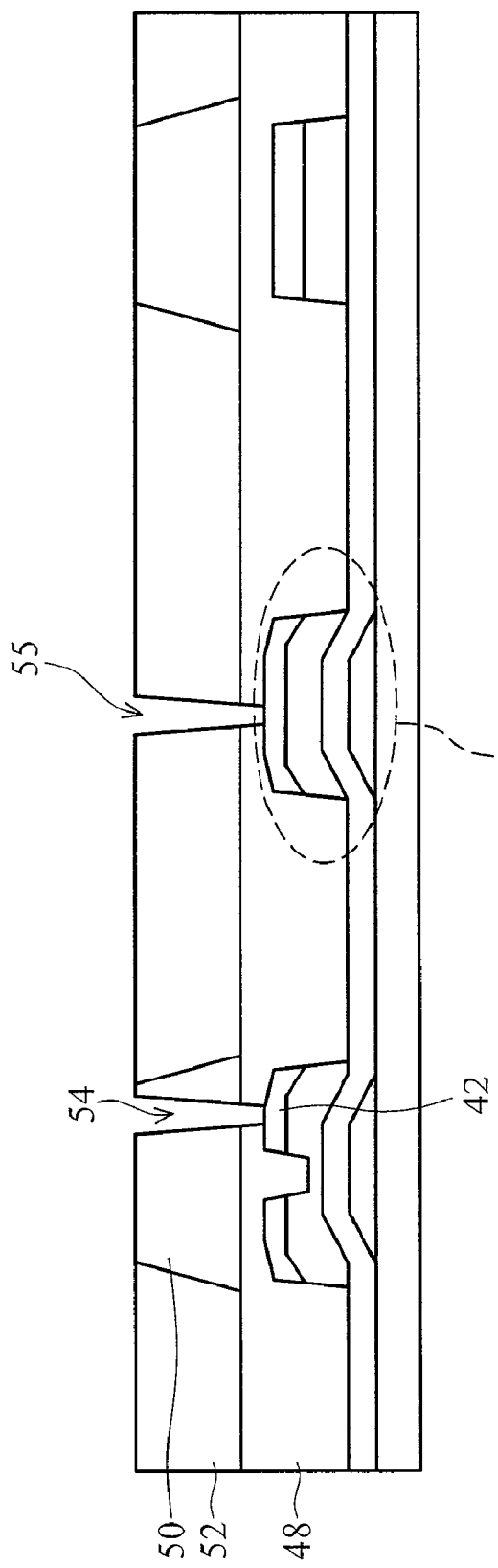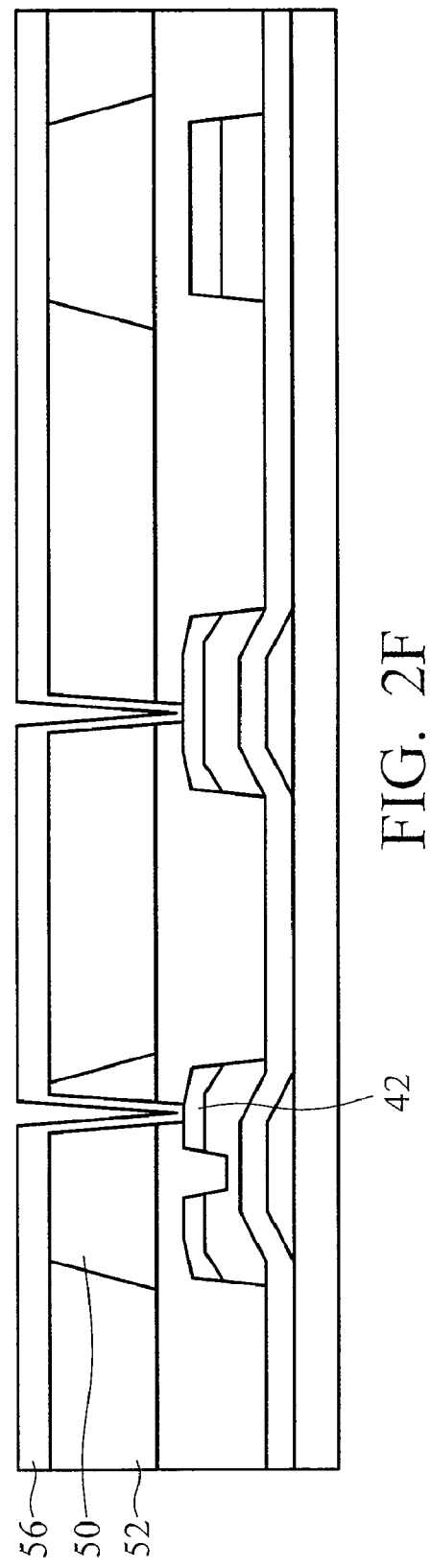

THIN FILM TRANSISTOR ARRAY SUBSTRATE STRUCTURES

CROSS-REFERENCE TO RELATED APPLICATION

This application is a division of pending U.S. patent application Ser. No. 11/859,832, filed Sep. 24, 2007, which is a Continuation-In-Part of U.S. patent application Ser. No. 11/461,015, filed Jul. 31, 2006, now abandoned, the contents of which are incorporated herein by reference.

BACKGROUND OF THE INVENTION

1. Field of the Invention

The invention relates to a semiconductor structure, and in particular to a thin film transistor array substrate structure and fabrication method thereof.

2. Description of the Related Art

Liquid crystal displays (LCDs) are popularly utilized in personal computers, word processors, navigation systems, amusement machines, projectors, viewfinders and portable machines (such as watches, electronic calculators and televisions) because of low power consumption, thin profile, light weight and low driving voltage.

A color filter (CF) is a key component of a color LCD. Typically, the color filter and thin film transistors (TFTs), which act as driving switches, are disposed on two separate substrates and located on the opposite side of the liquid crystal layer. To prevent light from damaging the TFTs, a black matrix is formed on the color filter's substrate, above the thin film transistors. This arrangement, however, increases costs, processing time, and manufacturing complexity. Additionally, the black matrix must be wider in consideration of alignment errors, thus reducing panel aperture ratio.

In order to increase the panel aperture ratio, a color filter on array (COA) technique has been developed. The conventional COA method, however, requires 9 processes including 5 array processes and 4 color filter processes, increasing costs.

BRIEF SUMMARY OF THE INVENTION

The invention provides a thin film transistor array substrate structure comprising a thin film transistor array substrate, an organic material layer formed thereon, and a plurality of black matrices and color filter patterns disposed on the organic material layer.

The invention also provides a method of fabricating a thin film transistor array substrate structure comprising providing a substrate including thin film transistors, coating an organic material layer thereon, forming a plurality of black matrices on the organic material layer, printing a plurality of color filter patterns onto the organic material layer by ink-jet printing, forming a plurality of first openings through the black matrices and portions of the organic material layer by laser ablation to expose the thin film transistors, and forming the plurality of patterned transparent conductive layers on the black matrices, color filter patterns and the surfaces of the first openings to electrically connect to the thin film transistors through the first openings.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawing, wherein:

FIGS. 2A-2F are cross sections of a fabrication method of a thin film transistor array substrate structure of the invention.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The invention provides a thin film transistor array substrate structure comprising a substrate including thin film transistors, an organic material layer formed thereon, and a plurality of black matrices and color filter patterns disposed on the organic material layer.

The organic material layer may comprise benzocyclobutane (BCB), acrylic or methylsilazane (MSZ). The black matrix may comprise organic materials and has a thickness less than 5 μm. The color filter patterns may comprise organic dyes or pigments such as red, green and blue color filter patterns.

The array substrate structure further comprises a plurality of first openings, through the black matrices and portions of the organic material layer, connected to the thin film transistors, and a plurality of second openings, through the color filter patterns and portions of the organic material layer, connected to the storage capacitors. The second openings substantially have the same diameter. The array substrate structure further comprises a plurality of transparent conductive layers such as an indium tin oxide layers formed on the black matrices, color filter patterns and the surfaces of first and second openings, electrically connecting to the thin film transistors and storage capacitors through the first and second openings.

Figure 1:
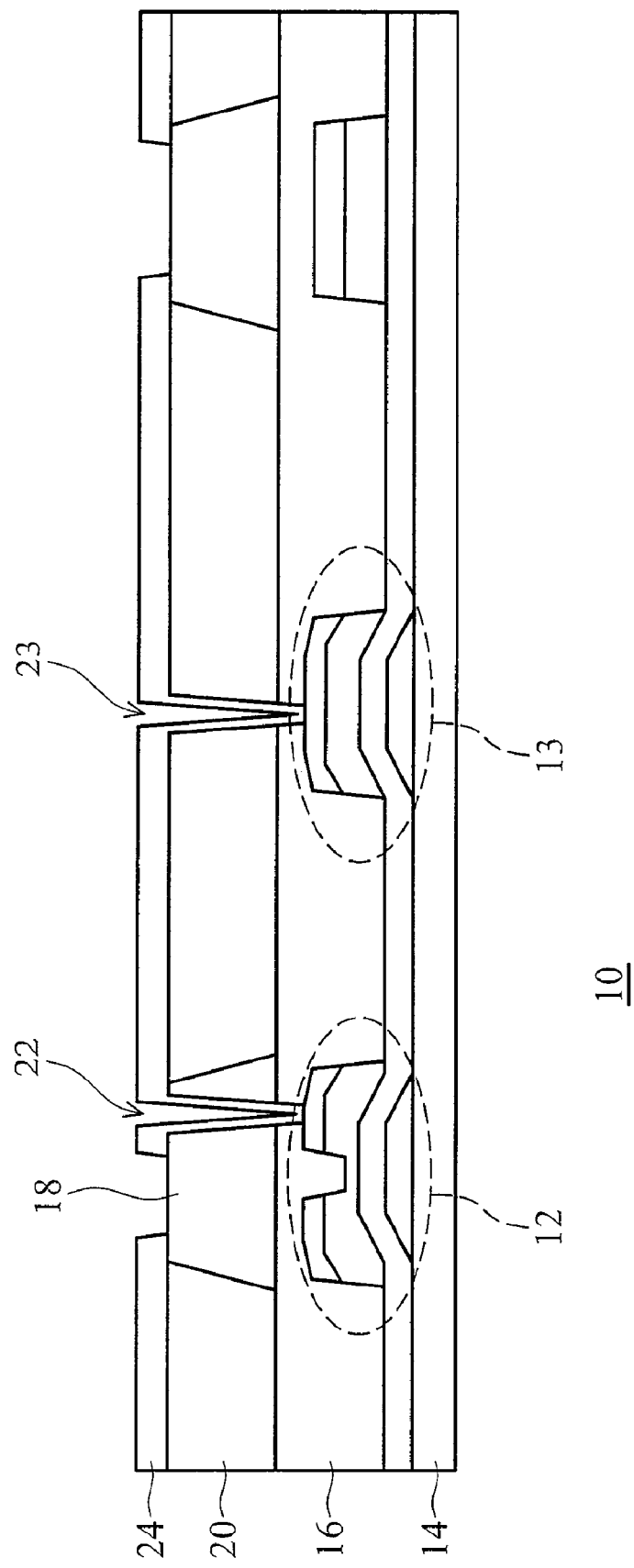
FIG. 1 is a cross section of a thin film transistor array substrate structure of the invention.

A thin film transistor array substrate structure 10 of the invention, as shown in FIG. 1 comprises a thin film transistor 12 and a storage capacitor 13 disposed on a substrate 14, an organic material layer 16, and a plurality of black matrices 18 and color filter patterns 20. The organic material layer 16 is formed on the substrate 14, storage capacitor 13 and thin film transistor 12. The black matrices 18 and color filter patterns 20 are disposed on the organic material layer 16. The substrate structure 10 further comprises a first opening 22 through the black matrix 18 and portion of the organic material layer 16, connecting to the thin film transistor 12 and a second opening 23 through the color filter pattern 20 and portions of the organic material layer 16, connecting to the storage capacitor 13. The substrate structure 10 further comprises an indium tin oxide layer 24 formed on the black matrices 18, color filter patterns 20 and the surfaces of the first opening 22 and the second opening 23, electrical connecting to the thin film transistor 12 and storage capacitor 13 through the first opening 22 and the second opening 23.

The invention also provides a method of fabricating a thin film transistor array substrate structure, in which a substrate including thin film transistors is provided. Next, an organic material layer is coated on the substrate. A plurality of black matrices are then formed on the organic material layer. Next, a plurality of color filter patterns are printed onto the organic material layer by ink-jet printing. A plurality of first openings are then formed through the black matrices and portions of the organic material layer by laser ablation, connecting to the thin film transistors. Next, a plurality of second openings are formed through the color filter patterns and portions of the organic material layer by laser ablation, connecting to a plurality of storage capacitors. Finally, the plurality of patterned transparent conductive layers are formed on the black matrices, color filter patterns and the surfaces of the first and second openings, electrical connecting to the thin film transistors and storage capacitors through the first and second openings.

The organic material layer may comprise benzocyclobutane (BCB), acrylic or methylsilazane (MSZ). The black matrix may comprise organic materials and the color filter patterns may comprise organic dyes or pigments such as red, green and blue color filter patterns.

The black matrices are formed on the organic material layer by lithography or laser ablation. The laser ablation has a laser energy density of about 10 $J/cm^2$~0.25 $mJ/cm^2$. The color filter patterns are printed onto the organic material layer at a printing rate of about 10 pl/drop~5 μl/drop. Additionally, the plurality of patterned transparent conductive layers such as indium tin oxide layer are formed on the black matrices, color filter patterns and the surfaces of the first and second openings by sputtering or coating.

Conventional silicon nitride or silicon oxynitride serves as a source/drain insulating protective layer. However, when an electrical connecting opening is formed through such material, a series of processes such as chemical vapor deposition, resist coating, exposure, development, etching, and resist stripping are required, resulting in complicated processes and high cost. In the invention, the novel organic material is substituted for the original material and planarization is achieved.

The processes of the thin film transistor array substrate structure include a combination of an ink-jet printing for fabricating color filter patterns (RGB colors) and a laser ablation for forming an electrical connecting opening. Compared to conventional lithography, this color filter on array (COA) process is simplified, significantly reducing cost.

However, when openings are created by laser ablation under the same condition, variations of opening sizes may occur due to different laser energy absorption between black matrix and various color filter patterns, deteriorating subsequent connection of indium tin oxide electrode. The invention provides a simple and low-cost method to solve this problem.

The fabrication method of the thin film transistor array substrate structure of the invention is disclosed in FIGS. 2A-2F.

Figure 2A:
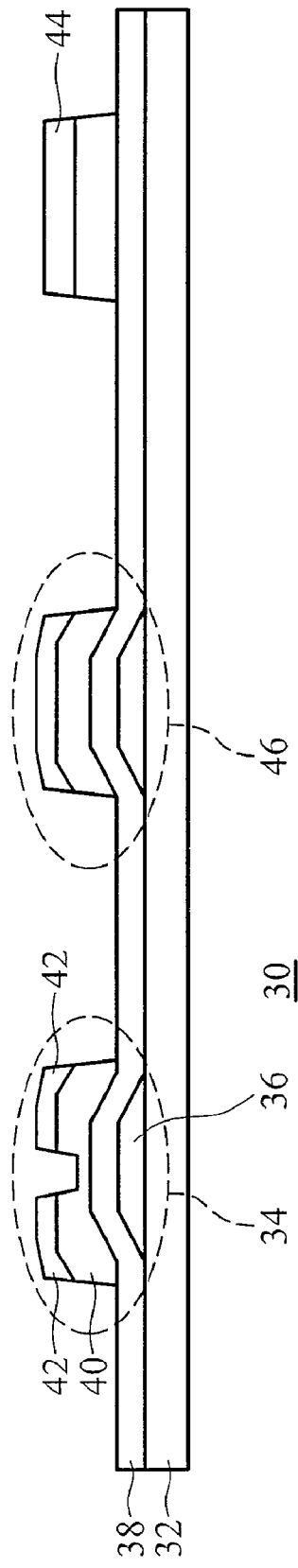

Referring to FIG. 2A, a thin film transistor array substrate 30 comprising a substrate 32 such as glass substrate and a thin film transistor 34 disposed thereon is provided. The thin film transistor 34 is composed of a gate electrode 36, an insulating layer 38 such as silicon dioxide, an amorphous silicon/$n^+$ amorphous silicon layer 40 and source/drain 42 formed by a metal layer. A metal data line 44 connected to the source is further formed on a specific area of the substrate 32. Generally, the gate electrode 36 is arranged in a horizontal orientation and the data line 44 in a vertical orientation, thereby defining a plurality of rectangular pixels (not shown). Also, a storage capacitor 46 connected to the drain is fabricated on the substrate 32.

Figure 2B:
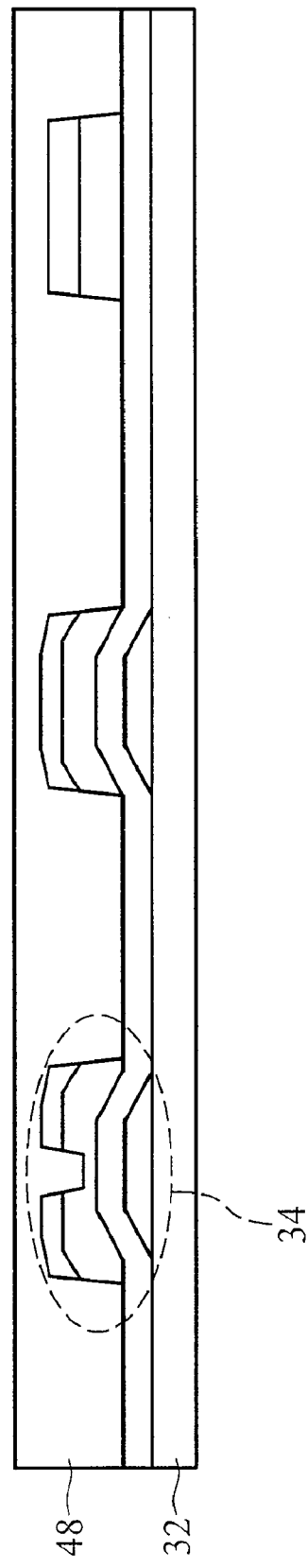

Referring to FIG. 2B, an organic material layer 48 is coated on the substrate 32 and the thin film transistor 34. The organic material layer may comprise benzocyclobutane (BCB), acrylic or methylsilazane (MSZ).

Figure 2C:
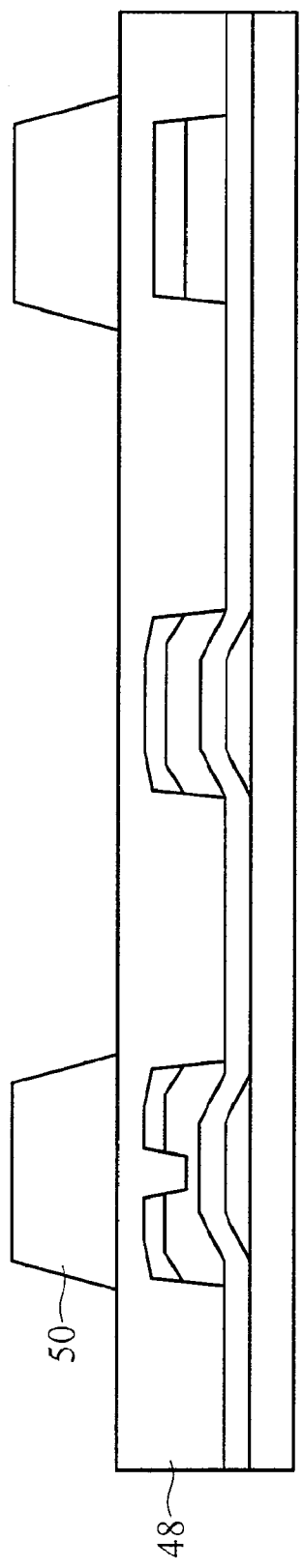

Next, a plurality of black matrices 50 are defined on the organic material layer 48 by lithography or laser ablation, as shown in FIG. 2C. The black matrix 50 may comprise organic materials. The laser ablation has a laser energy density of about 10 $J/cm^2$~0.25 $mJ/cm^2$.

Figure 2D:
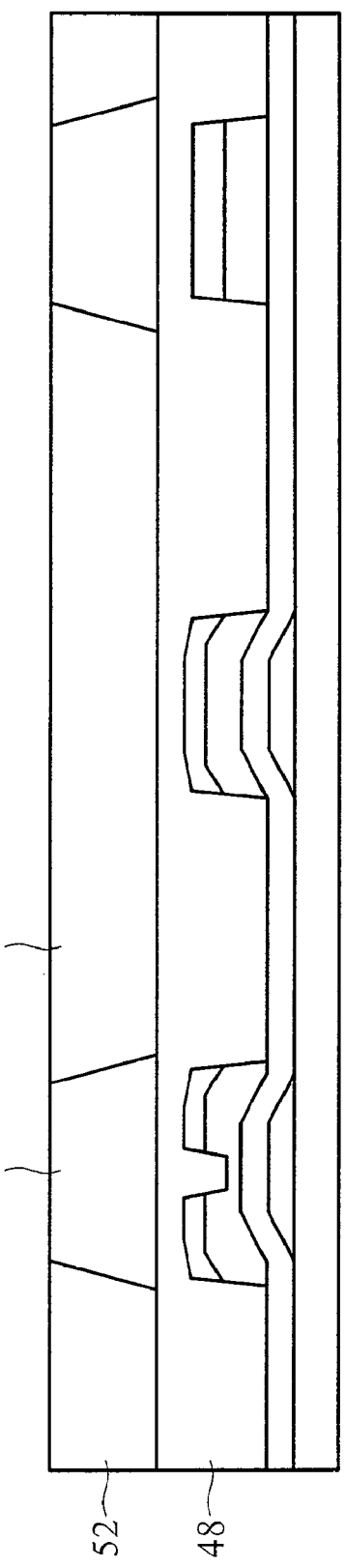

Referring to FIG. 2D, a plurality of color filter patterns 52 such as RGB colors are printed onto the organic material layer 48 by ink-jet printing. The color filter patterns 52 may comprise organic dyes and are printed at a printing rate of about 10 pl/drop~5 μl/drop.

Referring to FIG. 2E, a first opening 54 is formed through the black matrix 50 and portions of the organic material layer 48 to expose to the source/drain 42 of the thin film transistor 34 and a second opening 55 is formed through the color filter pattern 52 and portions of the organic material layer 48 to connect to the storage capacitor 46 by laser ablation having a laser energy density of about 10 $J/cm^2$–0.25 $mJ/cm^2$.

Figure 3A:
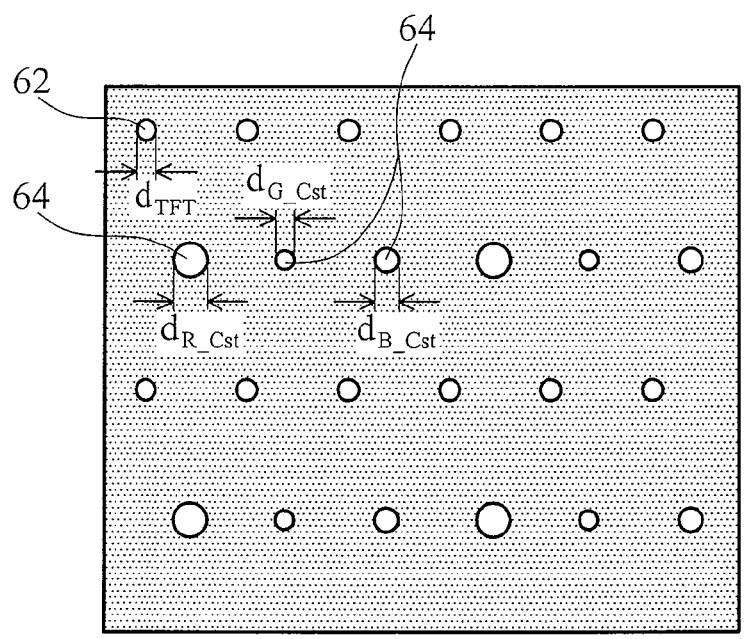
FIG. 3A shows the mask provided by the invention.

The detailed steps of formation of the first and second openings are described as follows. Referring to FIG. 3A, a mask 60 comprising a plurality of first holes 62 corresponding to the black matrices and a plurality of second holes 64 corresponding to the color filter patterns is provided. A laser is then provided to pass through the mask to form the first and second openings.

Specifically, the diameter of the second hole 64 is inversely proportional to the laser energy absorption of the color filter pattern corresponding to the second hole 64, that is, if the color filter pattern absorbs larger laser energy than other color filter patterns, the corresponding hole size should be smaller than others, for example, if green color filter pattern absorbs larger laser energy than blue color filter pattern and blue color filter pattern absorbs larger laser energy than red color filter pattern, the hole size corresponding to the green color filter pattern should be smaller than that of the blue color filter pattern and the hole size corresponding to the blue color filter pattern should be smaller than that of the red color filter pattern.

Figure 3B:
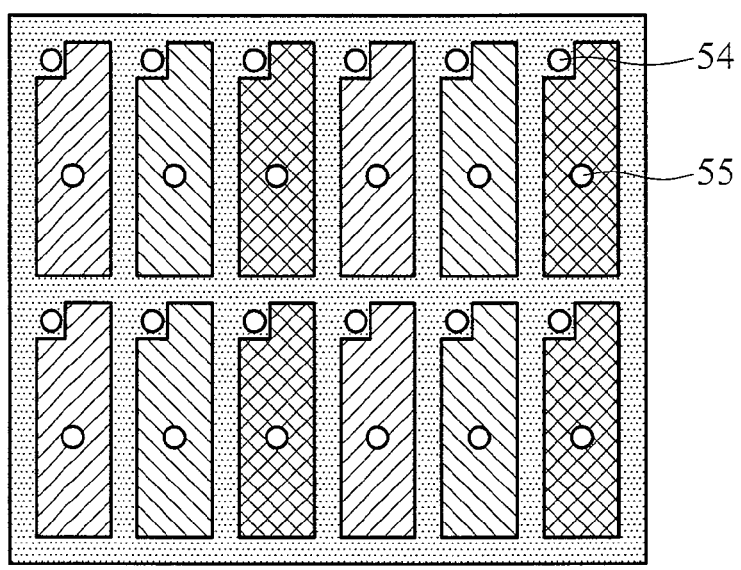
FIG. 3B shows various opening sizes after exposure through the mask provided by the invention.

The invention utilizes the specific mask and the one-step laser process to create uniform openings (for example, the first opening 54 and the second opening 55), as shown in FIG. 3B. The simple and low-cost method solves the conventional problems, facilitating subsequent connection of indium tin oxide electrode.

Referring to FIG. 2F, an indium tin oxide layer 56 is formed on the black matrices 50, color filter patterns 52 and the surface of the first opening 54 and second opening 55 to electrically connect to the source/drain 42 of the thin film transistor 34 and the storage capacitor 46.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A thin film transistor array substrate structure, comprising:
   a substrate, including a plurality of thin film transistor;
   an organic material layer formed thereon;
   a plurality of black matrices and color filter patterns comprising red, green and blue color filter patterns disposed on the organic material layer;
   a plurality of storage capacitors formed on the substrate; and
   a plurality of second openings, passing through the red, green and blue color filter patterns and portions of the organic material layer and connected to the storage capacitors, wherein the plurality of second openings substantially have the same diameter through a mask, wherein the mask comprises a plurality of holes corresponding to the red, green and blue color filter patterns and the diameters of the holes are inversely proportional to the energy absorption of the red, green and blue color filter patterns.

2. The thin film transistor array substrate structure as claimed in claim 1, wherein the organic material layer comprises benzocyclobutane (BCB), acrylic or methylsilazane (MSZ).

3. The thin film transistor array substrate structure as claimed in claim 1, wherein the black matrix comprises organic materials.

4. The thin film transistor array substrate structure as claimed in claim 1, wherein the black matrix has a thickness less than 5 µm.

5. The thin film transistor array substrate structure as claimed in claim 1, wherein the color filter pattern comprises organic dyes or pigments.

6. The thin film transistor array substrate structure as claimed in claim 1, further comprising a plurality of first openings through the corresponding black matrix and portion of the organic material layer respectively, connecting to the corresponding thin film transistor.

7. The thin film transistor array substrate structure as claimed in claim 6, further comprising a plurality of patterned transparent conductive layers, respectively formed on the corresponding black matrix and the corresponding color filter pattern, and electrically connected to the corresponding thin film transistor through the corresponding first opening.

8. The thin film transistor array substrate structure as claimed in claim 7, wherein the plurality of patterned transparent conductive layers comprise indium tin oxide layers.

* * * * *